United States Patent [19]
Chambers et al.

[11] Patent Number: 5,625,316
[45] Date of Patent: Apr. 29, 1997

[54] TUNING CIRCUIT FOR AN RC FILTER

[75] Inventors: Mark J. Chambers, Plantation, Fla.; Jesus P. Finol, Chandler, Ariz.; James B. Phillips, Plantation, Fla.

[73] Assignee: Motorola, Inc., Schaumburg, Ill.

[21] Appl. No.: 269,509

[22] Filed: Jul. 1, 1994

[51] Int. Cl.$^6$ .................. G25F 3/02; H03K 5/00
[52] U.S. Cl. .................. 327/553; 327/362; 327/539; 330/305; 333/173
[58] Field of Search .................. 333/172, 173; 327/553, 554, 538, 539, 512, 513, 187, 315, 311, 317, 344, 362, 558; 330/305, 306, 303, 107

[56] References Cited

U.S. PATENT DOCUMENTS

| | | | |
|---|---|---|---|
| 4,306,203 | 12/1981 | Sasaki et al. | 322/552 |
| 4,691,121 | 9/1987 | Van Roermund et al. | 322/553 |
| 4,851,719 | 7/1989 | Hitomi | 322/553 |
| 5,331,217 | 7/1994 | Moody et al. | 322/553 |
| 5,359,552 | 10/1994 | Dhong et al | 322/539 |

OTHER PUBLICATIONS

Gyrator Video Filter IC With Automatic Tuning, IEEE Journal of Solid-State Circuits, vol. SC-15, No. 6, Dec. 1980.

*Primary Examiner*—Timothy P. Callahan
*Assistant Examiner*—Dinh T. Le
*Attorney, Agent, or Firm*—John G. Rauch; Barbara Doutre

[57] ABSTRACT

A tuning circuit (202) uses a precision current reference (Iref) along with an analog-to-digital converter (218) to produce a digital output (228) to represent variations of internal resistance values. The precision current reference (Iref) is fed to an internal tuning resistor (R210) in order to provide an analog voltage signal to the analog-to-digital converter (218). The analog voltage signal changes in accordance with the variations in the tuning resistor value over process and temperature. The digital output (228) controls programmable capacitor arrays (C220, C222) which are included in the tuning circuit (202) as well as in an active RC filter (208) whose bandwidth is controlled by the programmable capacitor arrays (C220, C222) and internal resistors (R212, R214, R216).

8 Claims, 3 Drawing Sheets

TUNING CIRCUIT FOR AN RC FILTER

TECHNICAL FIELD

This invention relates generally to analog signal processing systems and more specifically the tuning of analog signal processing systems.

BACKGROUND

Analog signal processing systems frequently employ active analog filters constructed of operational amplifiers (op-amps), resistors, and capacitors. For inexpensive mixed signal integrated circuit (IC) processes such as digital complimentary-symmetry metal-oxide-semiconductor (CMOS), large value integrated resistors typically have a poor manufacturing tolerance (approximately 25%) and a relatively high temperature coefficient of approximately 5000 parts per million per degree Celsius (5000 ppm/°C.).

Referring now to FIG. 1 of the accompanying drawings, there is shown a prior art integrated active resistance-capacitance (RC) filter 100 known as a second order Saylen-Keye active RC low pass filter. Resistors R102, R104, R106 and capacitors C108, C110 control the −3 dB bandwidth of the filter 100, and these resistors are typically integrated on chip as resistor arrays under microprocessor control. These resistor arrays exhibit the problems associated with having the poor manufacturing tolerances, and the −3 dB bandwidth can vary by nearly a full order of magnitude. For active RC filters of this complexity, it is impractical to use external precision resistors as a substitute for the internal diffused resistance. Further disadvantages associated with using theses resistor arrays include the amount of die space required and the relatively high cost of the analog process. Filter circuits, such as the Saylen-Keye filter 100, often require manual tuning, usually in the form of programming, of the resistor arrays at the factory level in order to compensate for variations in the process characteristics. This further drives up the cost and time involved in producing these circuits.

Hence, what is needed is an improved circuit and method of tuning an analog integrated circuit, such as the active RC filter 100, such that the circuit remains impervious to variations in process and temperature and relieves the burden of manual tuning.

DETAILED DESCRIPTION OF THE PREFERRED EMBODIMENT

In a very-large-scale-integrated (VLSI) circuit, up to 80% of the IC may be digital. In a digital process, analog component characteristics such as sheet resistance, are not well controlled. Hence, it is desired to use a digital process whenever possible. In digital CMOS technology, only processes relating to digital switching require tweaking. Because CMOS devices can be made quite small (that is occupying a small silicon area on an IC chip), and because the manufacturing process is relatively simple (as compared to analog), most VLSI circuits are made using CMOS technology.

The invention to be described herein uses a stable current reference, an analog-to-digital converter (i.e., ADC), and a programmable capacitor array (i.e., C-DAC) to digitally calibrate for internal resistor variation in active RC filters. With the addition of this invention, the filter's bandwidth sensitivity with respect to resistance is limited only by the resolution of the ADC.

Figure 1:
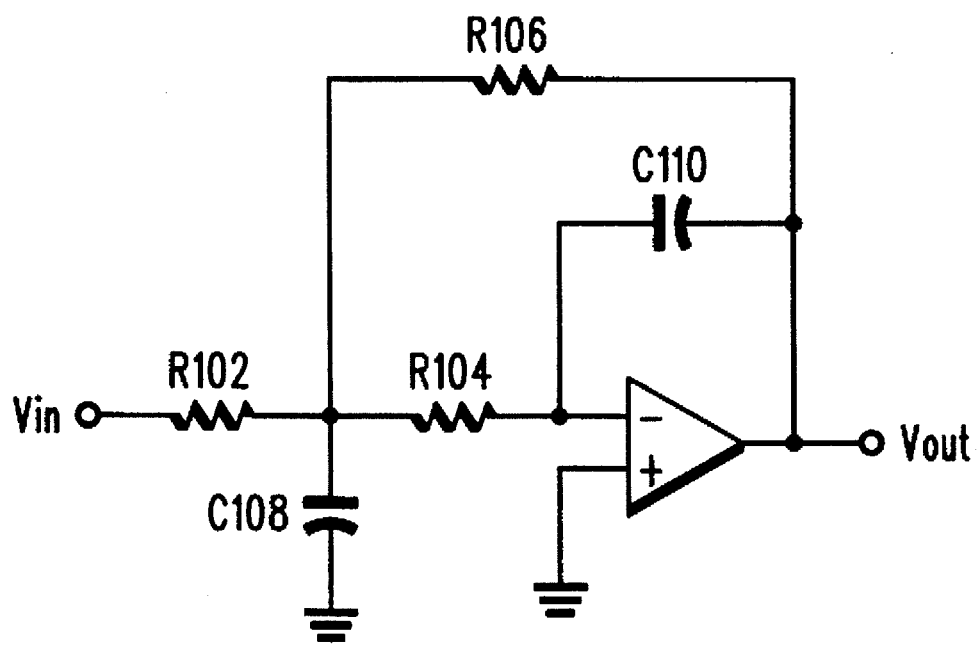
FIG. 1 is a prior art circuit diagram of a Saylen-Keye filter.
Figure 2:
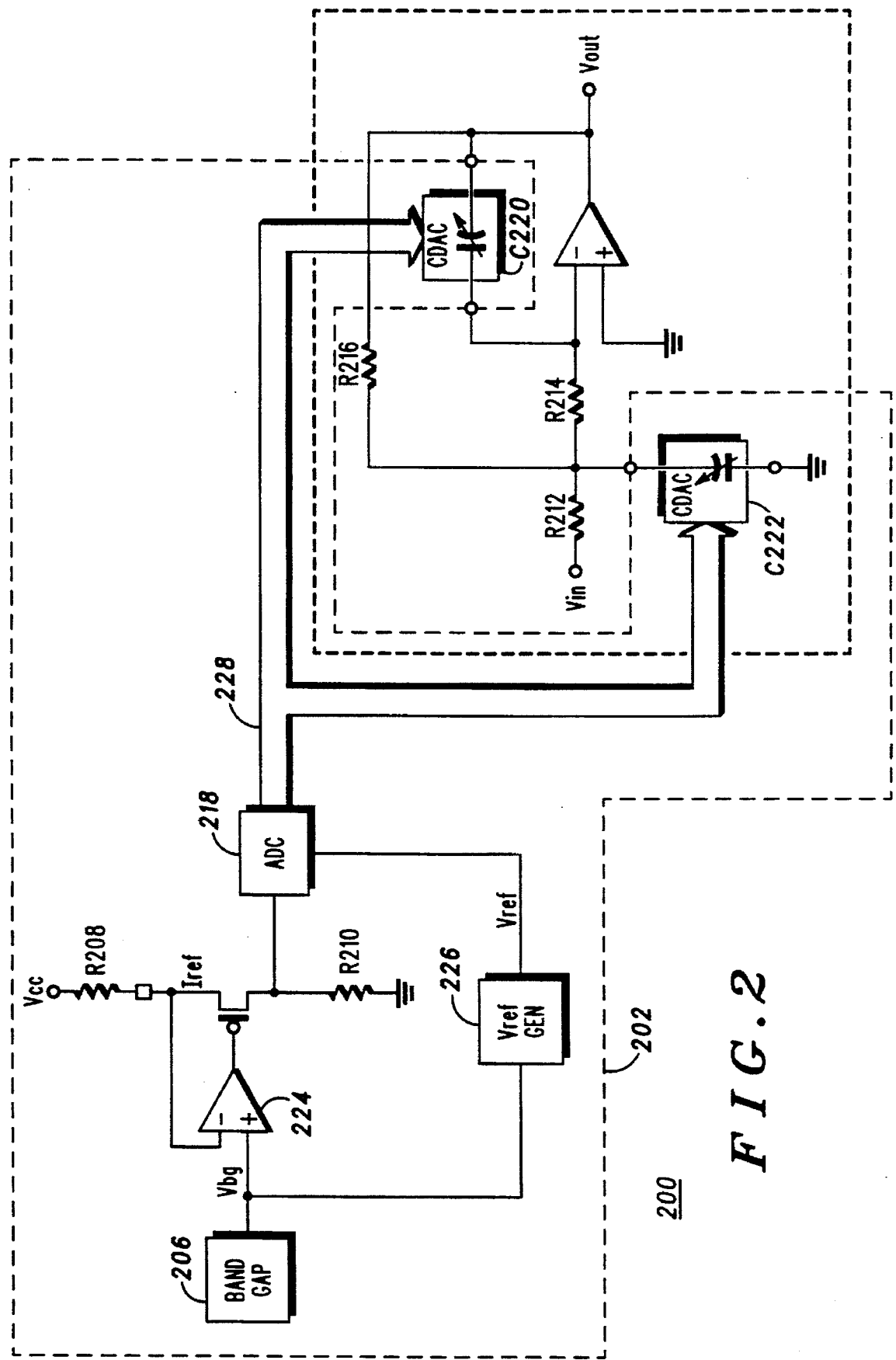
FIG. 2 is a circuit diagram in accordance with the present invention.

FIG. 2 illustrates an electrical block diagram of a self-calibrating resistance circuit for an active RC analog filter 200. Circuit 200 is preferably designed using CMOS technology and comprises a self-calibrating resistance portion, or electronic tuning circuit, 202 and an RC filter portion 204. The RC filter portion 204, in the preferred embodiment of the invention, comprises a second order Saylen-Keye active RC filter, similar to that of FIG. 1. The tuning circuit 202 includes an internal bandgap voltage reference 206 and a single external precision resistor (e.g. 1% tolerance) R208 that are used to implement a stable current reference (Iref). This reference current is coupled into an internal "master" tuning resistor R210 resulting in a voltage drop that is directly proportional to the resistance value. In the preferred embodiment R210 tracks all other internal resistors R212, R214, 216 in the active RC filter 204 (i.e., over temperature and process). The voltage across R210 can be used to tune the filter's RC time constant(s). This is accomplished by converting the R210 voltage to an m-bit digital code 228 using an analog- to-digital converter circuit (ADC) 218.

The digital output from the ADC 218 drives digital programmable capacitor arrays (i.e., C-DACs) C220, C222 which are common to both the electronic tuning circuit 202 and the RC filter portion 204. The C-DACs C220, C222 are configured so that an increase in the ADC 218 input voltage (corresponding to an increase resistance) is matched by a corresponding decrease in the C-DACs capacitance's C220 and C222, thus maintaining a more constant filter bandwidth. As the m-bit word 228 changes with the variations of the input voltage to the ADC 218, the capacitor arrays will vary inversely to the changes in the tuning resistor R210. For example as the voltage at the input to the ADC 218 goes up above the nominal level (for instance if the R210 has doubled) then half of the capacitance would be switched in to maintain a constant RC product, thus maintaining control over the −3 dB bandwidth of the RC filter 204.

In the preferred embodiment of the invention the bandgap voltage reference 206 sets a stable bandgap voltage, Vbg, with respect to the supply Vcc, so that the voltage delta Vcc–Vbg is stable over temperature and process. The Vbg voltage then gets buffered, preferably by an op-amp 224, that applies the same voltage to its' negative terminal. The stable delta voltage, Vcc–Vbg, and precision external resistor R208 set up the stable reference current (Iref). The stable reference current and internal tuning resistor R210 generate an analog voltage signal that gets coupled to the input of the ADC 218.

Also included in the self-calibrating resistance portion 202, is a stable reference voltage generator 226, controlled by the bandgap voltage Vbg, which provides a stable voltage reference, Vref, for the ADC 218. The input to the ADC 218 is compared to Vref through comparators (not shown) located within the ADC 218. The reference voltage Vref sets a maximum value for the ADC 218, and the input to the ADC 218 is preferably derived in terms of Vref.

In the preferred embodiment of the invention, the internal tuning resistor R210 is made up of substantially the same type of resistor material as the other internal resistors R212, R214, R216 such that the tuning resistor is matched (same geometry) to the internal resistors of the active RC filter 204. The tuning resistor R210 is preferably physically close to the internal resistors R212, R214, R216 as well. Since R210 is a resistor that will vary, then by forcing the fixed stable current (Iref) through R210, the voltage generated at the input of the ADC 218 will vary in proportion with the variation of R210. Based on the nominal sheet resistance at room temperature, the nominal voltage to the input of the ADC 218 is set.

In the preferred embodiment the RC filter 204 is a second order filter so there are two single pole time constants cascaded and controlled by C-DACs C220 and C222 and resistors R212, R214, R216.

By applying the self calibrating resistance circuit 202, as described by the invention, to the RC filter 204, the variation in resistance is sensed and compensated for by a proportionate capacitance so that the product of the resistance times capacitance (time constant ) of the RC filter 204 may be calibrated.

Figure 3:
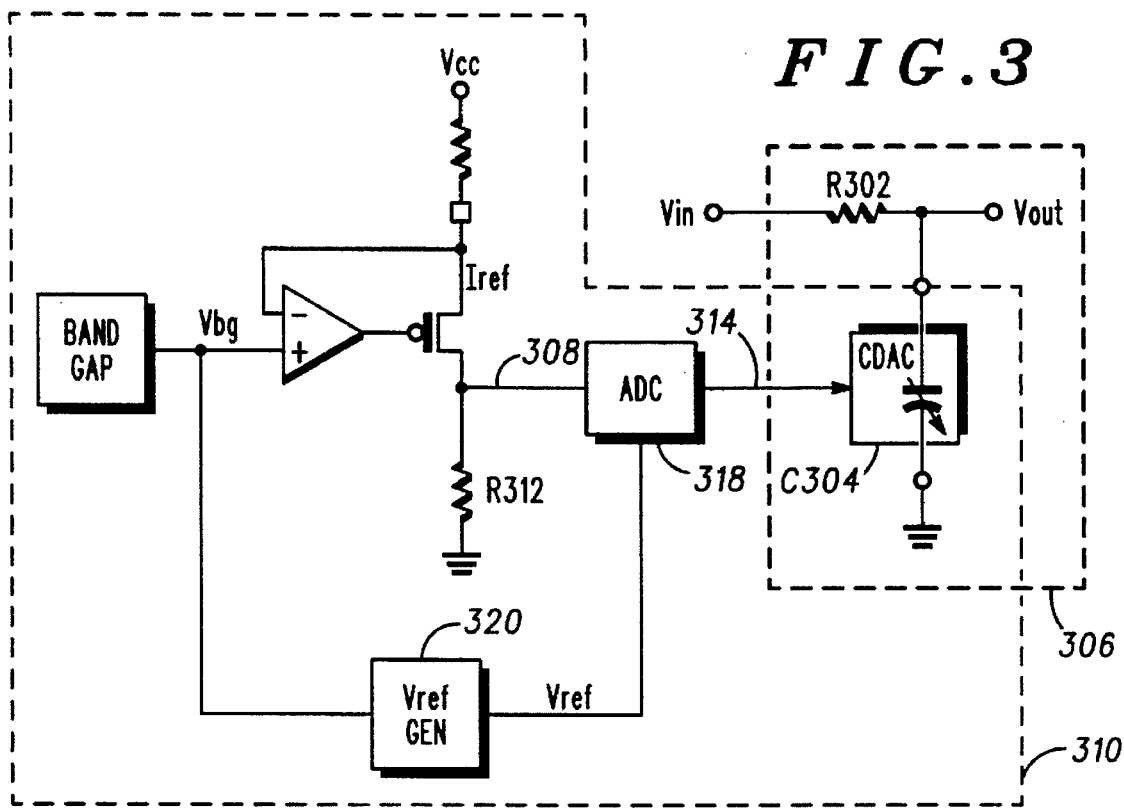
FIG. 3 is another circuit diagram in accordance with the present invention.
Figure 4:
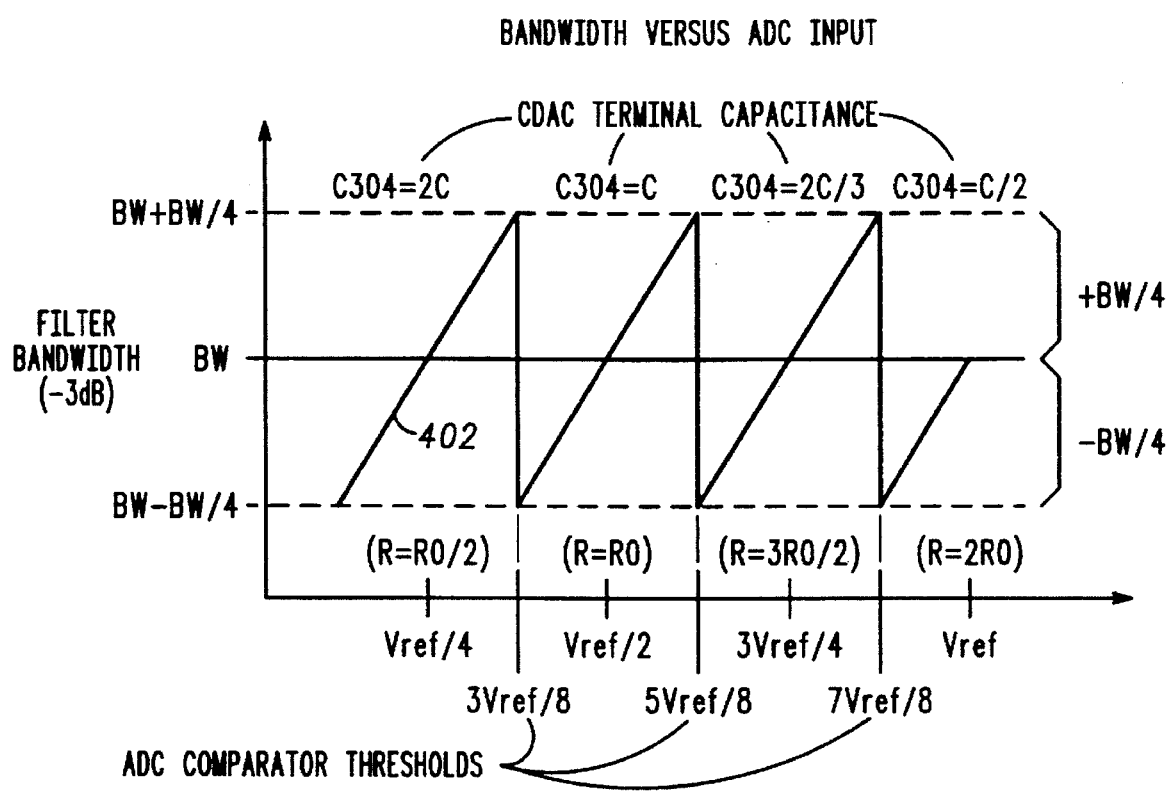
FIG. 4 is a graph representing the bandwidth variation in accordance with the circuit of FIG. 3.

An example of an integrated 2-bit self calibrating single pole RC filter in accordance with the present invention is given in FIG. 3 with a corresponding graphical output of filter bandwidth versus ADC input voltage at FIG. 4. Resistor R302 is an internal resistor which varies considerably over process and temperature variation and is combined with C-DAC C304, making up the single pole RC filter 306. Tuning circuit 310 is similar to the tuning circuit 202 of FIG. 2 and controls the bandwidth of RC filter 306. Internal tuning resistor R312 is preferably designed to have a similar geometry to that of resistor R302. Here, ADC input voltage 308 corresponds to a doubling of the nominal resistance value R312 such that:

maximum ADC input voltage=2×(Iref×R312)=Vref, where Vref is the maximum reference voltage set for the ADC 318 by Vref generator 320. The input voltage to the ADC 318 is given as a derivative of the reference voltage Vref.

In this example, a fully parallel ADC architecture is assumed with the ADC input comparator thresholds set at 3 Vref/8, 5 Vref/8, and 7 Vref/8. As shown in the graph of FIG. 4, art ADC input voltage 308 between 0 and 3 Vref/8 programs in a capacitor value of C304=2C, and an input voltage between 3 Vref/8 and 5 Vref/8 programs in a capacitor value of C304=C. An input voltage between 5 Vreg/8 and 7 Vref/8 programs in a capacitor value of C304=2C/3. Finally, an input voltage 308 between 7 Vref/8 and Vref programs in a capacitor value of C304=C/2. For this 2-bit example, an 8 times variation in the resistor value R312 (i.e., from 0.25 R to 2 R) results in only a +/–25% variation in the nominal filter bandwidth (BW) as illustrated by SAW tooth. 402. This example describes a simple single pole filter 306 using the tuning circuit 310 to control a digital calibration word 314 that adjusts the value of the capacitance of the C-DAC C304. In order to maintain a constant bandwidth of say 1 MHz (megahertz) while the internal resistor R302 may vary due to temperature and process variations, the capacitance inversely tracks the resistance using tuning resistor R312 so the time product remains controlled. If the capacitors were not tuned there would be an error of at least 8 times the bandwidth.

The two bit ADC as described in FIGS. 3 and 4 maintains the bandwidth variation such that the bandwidth varies by no more than +/–25% with a nine to one variation in resistance (Ro/4 to 9Ro/4). While the preferred embodiment of the invention describes only a two bit ADC, an even greater control of the bandwidth may be achieved if the resolution of the ADC is increased. For example, a 4-bit resolution would reduce the bandwidth variation to BW+/–6.25%, a four times improvement over the 2-bit resolution. A 6-bit resolution would achieve a bandwidth control of BW+/–1.5%. By increasing the resolution however, there is an increase in errors (i.e., the SAW tooth 402 of FIG. 4 would be wider), but for a given resolution, a wider range of resistor variation can be covered. The example of FIG. 3 illustrates a variation in internal resistance on the order of a magnitude which represents a good approximation for even a poorly controlled IC process.

The tuning circuit as described by the invention provides a method for digitally calibrating internal resistor variation in active integrated circuits by first, setting a stable reference current and providing an analog voltage signal in response to the stable reference current and the internal resistor variation. Then, by converting the analog voltage signal into a digital code word which represents the internal resister variation, a capacitance value can be varied based on the digital code word, thereby digitally calibrating the internal resister variation.

The tuning circuit, or self-calibrating resistance circuit, as described by the invention uses a precision current reference along with an analog-to-digital converter to produce a digital output code that essentially represents the variation in resistance from the nominal design value. The digital output programs a capacitor array in such a manner that the overall RC time constant(s) does not change. Thus, a simple open loop calibration for resistor variation is performed.

Furthermore, the self-calibrating resistance circuit, as described by the invention, can be used in any analog signal processing circuit which uses RC filters. It is especially useful for high order filters where the number of internal resistors exceeds 2 or 3. For example, present baseband pulse shaping modulator circuits employ switched capacitor sampled data filters as the main pulse shaping low pass filter. This type of filter must be followed by a "continuous time" (i.e., non-sample data) low pass filter to remove the sampled data spectral images. A $3^{rd}$ or $4^{th}$ order active RC Butterworth filter is used for this function. Since the exact –3 dB corner frequency is not as critical for this filter, a 2-bit calibration circuit as described by the invention would be adequate.

The tuning circuit as described by the invention is not limited solely to filter circuits and may be applied to other mixed signal integrated circuits that use resistors. This self-calibrating resistance provides an auto calibration approach to internally self tune an analog signal processing circuit on board an integrated circuit. This relieves a factory from having to manually tune these circuits and reduces the time and cost in developing analog signal processing circuits. The self-calibrating resistance circuit tunes out variations in resistor variations and provides a method for digitally calibrating internal resistor variation in an integrated circuit.

What is claimed is:

1. An electronic tuning circuit for tuning an RC filter circuit, the RC filter circuit including a resistor and a programmable capacitor array, the electronic tuning circuit being coupled externally to the RC filter circuit, the electronic tuning circuit comprising:

a reference current source for generating a substantially stable reference current, the reference current source including a bandgap reference for providing a bandgap voltage;

a reference resistor substantially matched to the resistor, the reference resistor coupled to the bandgap reference for receiving the reference current and transforming the reference current into a voltage signal at a node:

an analog-to-digital converter coupled between the node and the programmable capacitor array for receiving the voltage signal and providing a digital output to the programmable capacitor array.

2. An electronic tuning circuit as described in claim 1, wherein the analog-to-digital converter is a 2-bit analog-to-digital converter.

3. A method for controlling bandwidth of an active RC integrated filter having a resistor and a capacitor array, the method comprising the steps of:

generating an external stable reference current in response to a bandgap voltage;

providing the stable reference current to an external reference resistor at a node, the external reference resistor being substantially matched to he resistor;

providing an analog voltage signal at said node;

converting the analog voltage signal to a digital code word;

varying a capacitance value of the capacitor array based on the digital code word for controlling the bandwidth by varying the capacitance value.

4. An electronic circuit for controlling RC time constants in an active integrated filter circuit, the active integrated filter circuit including resistors and a capacitor array, the electronic circuit being externally coupled to the active integrated filter circuit, the electronic circuit comprising:

a stable current reference source for providing a stable current, the stable current reference source including:
a precision external resistor;
a bandgap reference coupled to the external resistor and providing a stable bandgap voltage; and
a buffer circuit coupled to the bandgap reference for buffering the stable bandgap voltage, the stable badgap voltage and the precision resistor providing the stable current;

an internal resistor coupled to the buffer circuit at a node and substantially matched to the resistors of the integrated filter circuit and providing an analog voltage signal based on the stable current; and an analog-to-digital converter coupled between the node and the capacitor array for receiving the analog voltage signal and generating a digital output, the digital output varying according to changes of the internal resistor; and wherein, said capacitor array generates a capacitance value based on the internal resistor.

5. An electronic circuit as described in claim 4, further comprising a reference generator coupled to the bandgap reference and the analog-to-digital converter for receiving the stable bandgap voltage and providing a maximum reference limit to the analog-to-digital converter.

6. An electronic circuit as described in claim 4, wherein the external precision resistor comprises a substantially 1% tolerance precision external resistor.

7. A self-calibrating active analog filter circuit having an input and an output, the circuit comprising:

an integrated active RC filter coupled between the input and the output and including:
an integrated programmable capacitor array; and
integrated resistors coupled to the integrated programmable capacitor array;

an external reference source providing a precision current reference signal;

an integrated resistor coupled to the external current source for setting an analog voltage signal based on the precision current reference signal, the integrated resistor substantially matched to the integrated resistors; and an integrated analog-to-digital converter coupled to the integrated resistor and the integrated programmable capacitor array for receiving the analog voltage signal and producing a digital code word, the integrated programmable capacitor array generating a capacitance value based on the digital code word, the programmable capacitor array in conjunction with the integrated resistors providing a stable RC time constant to the integrated active RC analog filter.

8. A self-calibrating active analog filter circuit as described in claim 7, wherein the external current reference source comprises:

an external resistor;

a bandgap voltage reference coupled to the external resistor providing a bandgap voltage signal;

an operational amplifier having a first input coupled to the bandgap voltage reference, a second input coupled to a reference potential, and an output coupled to the external resistor for providing the bandgap voltage signal to the external resistor, thereby providing the precision current reference signal.

* * * * *